United States Patent
Yeon

(10) Patent No.: US 9,862,220 B2
(45) Date of Patent: Jan. 9, 2018

(54) DONOR SUBSTRATE FOR LASER INDUCED THERMAL IMAGING, METHOD OF LASER INDUCED THERMAL IMAGING AND METHOD OF MANUFACTURING AN ORGANIC LIGHT EMITTING DISPLAY DEVICE USING THE SAME

(71) Applicant: Samsung Display Co., Ltd., Yongin-si, Gyeonggi-do (KR)

(72) Inventor: Jung-Hoon Yeon, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 9 days.

(21) Appl. No.: 14/919,613

(22) Filed: Oct. 21, 2015

(65) Prior Publication Data

US 2016/0039238 A1     Feb. 11, 2016

Related U.S. Application Data

(62) Division of application No. 14/046,103, filed on Oct. 4, 2013, now Pat. No. 9,193,205.

(30) Foreign Application Priority Data

Apr. 30, 2013  (KR) .................... 10-2013-0048537

(51) Int. Cl.
*B41M 5/42*    (2006.01)
*B41M 5/46*    (2006.01)
*H01L 51/00*   (2006.01)

(52) U.S. Cl.
CPC ............... *B41M 5/46* (2013.01); *B41M 5/42* (2013.01); *B41M 5/426* (2013.01);
(Continued)

(58) Field of Classification Search
CPC .......... B41M 5/42; B41M 5/426; B41M 5/46; B41M 2205/02; B41M 2205/06; B41M 2205/30; B41M 2205/38
(Continued)

(56) References Cited

U.S. PATENT DOCUMENTS 7,674,749 B2 *  3/2010  Kang ..................... B41M 5/265
                                                    428/32.81
8,821,963 B2    9/2014  Tanaka et al.
(Continued)

FOREIGN PATENT DOCUMENTS

JP   2003-025736   1/2003
KR   2006-0044251  5/2006
(Continued)

*Primary Examiner* — Bruce H Hess
(74) *Attorney, Agent, or Firm* — Knobbe, Martens, Olson & Bear, LLP

(57) ABSTRACT

A donor substrate, a method of laser induced thermal imaging, and a method of manufacturing an organic light emitting display device are disclosed. In the method of laser induced thermal imaging, a donor substrate is provided to include a base substrate, a light to heat conversion layer, a transfer layer and a functional layer. The functional layer includes a material radiating an infrared light. The donor substrate is laminated to an acceptor substrate. A laser beam is radiated into the donor substrate, thereby forming an organic layer pattern on the acceptor substrate from the transfer layer. A position of the organic layer pattern is observed using an infrared microscope. A laser beam position is adjusted and the donor substrate is separated from the acceptor substrate.

2 Claims, 8 Drawing Sheets

(52) U.S. Cl.
CPC ..... *H01L 51/0013* (2013.01); *B41M 2205/02* (2013.01); *B41M 2205/06* (2013.01); *B41M 2205/30* (2013.01); *B41M 2205/38* (2013.01); *Y02E 10/549* (2013.01); *Y02P 70/521* (2015.11)

(58) Field of Classification Search
USPC ..................................................... 428/32.81
See application file for complete search history.

(56) References Cited

U.S. PATENT DOCUMENTS 8,921,129 B2 * 12/2014 Lee .................... H01L 51/0013
349/21
2005/0208237 A1   9/2005 Narita et al.
2009/0233006 A1   9/2009 Yamazaki et al.

FOREIGN PATENT DOCUMENTS

KR   10-2005-0119595   * 10/2007   ............. H05B 33/10
KR   2007-0096082     10/2007

* cited by examiner

DONOR SUBSTRATE FOR LASER INDUCED THERMAL IMAGING, METHOD OF LASER INDUCED THERMAL IMAGING AND METHOD OF MANUFACTURING AN ORGANIC LIGHT EMITTING DISPLAY DEVICE USING THE SAME

CROSS-REFERENCE TO RELATED APPLICATIONS

This application is a divisional application which claims priority under 35 U.S.C. §120 from U.S. patent application Ser. No. 14/046,103, filed Oct. 4, 2013, which claims priority to and the benefit of Korean Patent Application No. 10-2013-0048537 filed on Apr. 30, 2013 in the Korean Intellectual Property Office (KIPO), the disclosure of each of which is incorporated herein in its entirety.

BACKGROUND

Field

Example embodiments relate to donor substrates, methods of laser induced thermal imaging and methods of manufacturing organic light emitting display devices using the same. Particularly, example embodiments relate to donor substrates capable of easily observing a position of a transferred organic layer pattern, methods of laser induced thermal imaging using the same and methods of manufacturing organic light emitting display devices using the same.

Description of the Related Technology

Generally, organic light emitting display devices may include various organic layers such as an organic light emitting layer, a hole injection layer, an electron transfer layer, etc. In processes for forming the organic layers of conventional organic light emitting display devices, an ink jet printing process may use limited materials for forming the organic layers except the light emitting layer, and it may be necessary to form an additional structure on a substrate for the ink jet printing process. When using a deposition process for forming organic layers, it may be difficult to apply the deposition process to the organic light emitting display device having a relatively large area, because the deposition process may use a micro-dimensioned metal mask.

Recently, a laser induced thermal imaging process has been developed for forming organic layers of the organic light emitting display device. In the conventional laser induced thermal imaging process, a laser beam from a laser irradiation apparatus may be converted to a thermal energy, and a transfer layer of a donor substrate may be partially transferred on a display substrate of the organic light emitting display device by the thermal energy, thereby to form an organic layer pattern. As for the conventional laser induced thermal imaging process, however, the position of the organic layer pattern may be observed after removing the donor substrate from an acceptor substrate.

SUMMARY OF CERTAIN INVENTIVE ASPECTS

Some example embodiments provide a donor substrate capable of easily observing a position of a transferred organic layer pattern.

Some example embodiments provide a method of laser induced thermal imaging capable of easily observing a position of a transferred organic layer pattern.

Some example embodiments provide a method of manufacturing an organic light emitting display device capable of easily observing a position of a transferred organic layer pattern.

However, objects of example embodiments are not limited to the above, but can be variously expanded without departing from the present embodiments.

According to example embodiments, there is provided a donor substrate including a base substrate, a light to heat conversion layer, a transfer layer and a functional layer. The light to heat conversion layer is disposed on the base substrate. The transfer layer is disposed on the light to heat conversion layer. A functional layer is disposed to contact a surface of the light to heat conversion layer. The functional layer includes a material radiating an infrared light.

In some example embodiments, the functional layer may include silver (Ag) or a halide having a fluorescent property.

In some example embodiments, the functional layer may be disposed between the light to heat conversion layer and the transfer layer.

In some example embodiments, the functional layer may be disposed between the light to heat conversion layer and the base substrate.

According to example embodiments, there is provided a method of laser induced thermal imaging. In the method of laser induced thermal imaging, a donor substrate is provided to include a base substrate, a light to heat conversion layer, a transfer layer and a functional layer. The functional layer includes a material radiating an infrared light. The donor substrate is laminated to an acceptor substrate. A laser beam is radiated into the donor substrate, thereby forming an organic layer pattern on the acceptor substrate from the transfer layer. A position of the organic layer pattern is observed using an infrared microscope. A laser beam position is adjusted. The donor substrate is separated from the acceptor substrate.

In some example embodiments, observing the position of the organic layer pattern using the infrared microscope may be performed, before separating the donor substrate from the acceptor substrate.

In some example embodiments, a top surface of the acceptor substrate has a stepped portion.

In some example embodiments, observing the position of the organic layer pattern using the infrared microscope may include observing an infrared radiation difference at the stepped portion of the acceptor substrate.

In some example embodiments, separating the donor substrate from the acceptor substrate may include separating the functional layer from the acceptor substrate.

In some example embodiments, the functional layer may include silver or a halide having a fluorescent property.

In some example embodiments, the laser beam may include a solid-state laser or a gas-state laser.

According to example embodiments, there is provided a method of laser induced thermal imaging. In the method of laser induced thermal imaging, a donor substrate is provided to include a base substrate, a light to heat conversion layer, a transfer layer and a functional layer. The donor substrate has a first region and a second region. The functional layer includes a material radiating an infrared light. The donor substrate is laminated to an acceptor substrate. A laser beam is radiated into the first region of the donor substrate. A laser beam position is observed using an infrared microscope. A laser beam position is adjusted. A laser beam is radiated into the second region of the donor substrate, thereby forming an organic layer pattern on the acceptor substrate from the transfer layer. The donor substrate is separated from the acceptor substrate.

According to example embodiments, there is provided a method of manufacturing an organic light emitting display device. In the method, a donor substrate is provided to include a base substrate, a light to heat conversion layer, a transfer layer and a functional layer. The functional layer includes a material radiating an infrared light. A display substrate is provided to include a switching device, a first electrode and a pixel defining layer. The donor substrate is laminated to the display substrate. A laser beam is radiated into the donor substrate, thereby forming an organic layer pattern on the display substrate from the transfer layer. A position of the organic layer pattern is observed using an infrared microscope. A laser beam position is adjusted. The donor substrate is separated from the display substrate.

In some example embodiments, observing the position of the organic layer pattern using the infrared microscope may be performed, before separating the donor substrate from the display substrate.

In some example embodiments, the first electrode may have a top surface substantially lower than a top surface of the pixel defining layer, such that a stepped portion may be disposed between the first electrode and the pixel defining layer.

In some example embodiments, observing the position of the organic layer pattern using the infrared microscope may include observing a infrared radiation difference at the stepped portion of the display substrate.

According to example embodiments, a donor substrate may further include a functional layer disposed adjacent to the light to heat conversion layer. The functional layer may be formed using the fluorescent material or the ink, such that the functional layer may radiate the infrared light. When the donor substrate is used in the laser induced thermal imaging, it is possible to inspect a position of a transferred organic layer pattern by detecting the infrared light from the functional layer. Particularly, when the donor substrate is laminated on an acceptor substrate having a stepped portion, it is possible to inspect a position of the stepped portion by detecting the infrared light.

BRIEF DESCRIPTION OF THE DRAWINGS

Example embodiments will be more clearly understood from the following detailed description taken in conjunction with the accompanying drawings.

FIGS. 1 to 13 represent non-limiting, example embodiments as described herein:

FIG. 1 is a perspective view illustrating a laser induced thermal imaging apparatus in accordance with some embodiments;

FIG. 2 is a cross-sectional view illustrating a donor substrate for laser induced thermal imaging in accordance with some embodiments;

FIG. 3 is a cross-sectional view illustrating a donor substrate for laser induced thermal imaging in accordance with other embodiments;

FIG. 4 is a perspective view illustrating an acceptor substrate in FIG. 1;

FIG. 5 is a flow chart illustrating a method of laser induced thermal imaging in accordance with some embodiments;

FIG. 6 is a flow chart illustrating a method of laser induced thermal imaging in accordance with other embodiments; and FIGS. 7 to 10 are a perspective view and cross-sectional views illustrating a method of manufacturing an organic light emitting display device in accordance with some embodiments.

DETAILED DESCRIPTION OF CERTAIN INVENTIVE EMBODIMENTS

Figure 1:
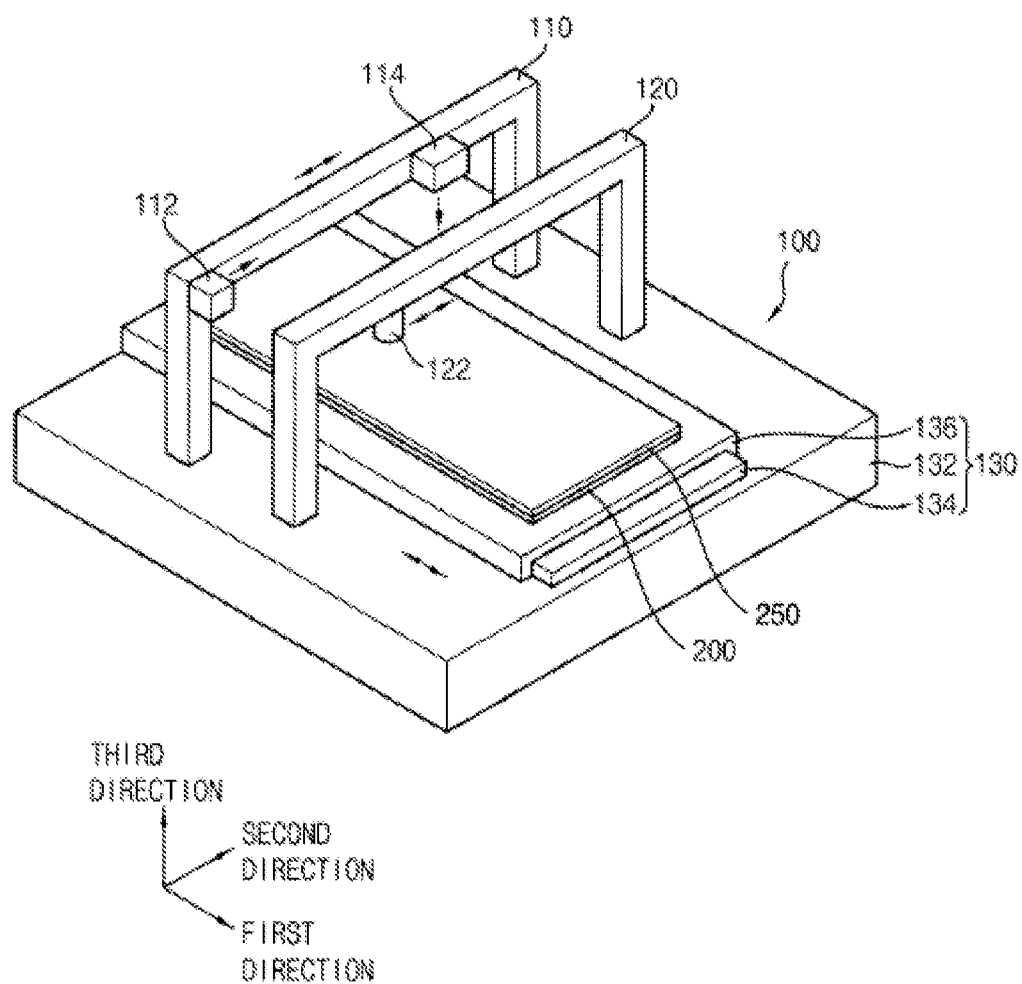

Various example embodiments will be described more fully hereinafter with reference to the accompanying drawings, in which some example embodiments are shown. The present embodiments may, however, be embodied in many different forms and should not be construed as limited to the example embodiments set forth herein. Rather, these example embodiments are provided so that this disclosure will be thorough and complete, and will fully convey the scope of the present embodiments to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a laser induced thermal imaging apparatus in accordance with some embodiments.

Referring to FIG. 1, a laser induced thermal imaging apparatus 100 may include a laser beam source 112, an optical system 114, an infrared microscope 122 and a substrate stage 130.

The laser beam source 112 may generate a laser beam. For example, the laser beam may include a solid-state laser such as a ruby laser, a yttrium-aluminium-garnet (YAG) laser, a yttrium-lithium-fluoride (YLF) laser, etc. or a gas-state laser such as an excimer layer, helium-neon layer, etc.

The optical system 114 may manipulate the laser beam received from the laser beam source 112. The optical system 114 may manipulate the laser beam into a desired shape such as a line beam or a squared beam. The optical system 114 may be disposed on an optical path of the laser beam, which is between the laser beam source 112 and the substrate stage 130.

In some example embodiments, the optical system 114 may include a homogenizer which may homogenize the laser beam. The optical system 114 may further include a mirror or a lens which may reflect or refract the laser beam. For example, the mirror may be a galvano mirror that may rotate depending on an input voltage. Therefore, a progress direction of the laser beam may be adjusted using the mirror or the lens.

In other example embodiments, the optical system 114 may include various combinations of optical components such as a condensing lens or a polarizer.

The laser beam source 112 and the optical system 114 may be mounted on the first guide bar 110. In some example embodiments, the optical system 114 may move in a second direction according to the first guide bar 110. Therefore, the laser beam position on the donor substrate 250 may be adjusted in the second direction.

The positions of the laser beam source 112 and the optical system 114 may not be limited to FIG. 1. For example, the laser beam source 112 and the optical system 114 may be arranged in a third direction substantially perpendicular to a top surface of the donor substrate 250. In this case, the optical system 114 may not include the mirror.

The infrared microscope 122 may include at least two lenses and a charge coupled device (CCD). For example, the lenses may include an objective lens and an ocular to allow a magnified view of the same. The CCD may have a sufficient sensitivity to an infrared light. Therefore, the infrared microscope 122 may observe the infrared light generated from the donor substrate 250.

The infrared microscope 122 may be mounted on a second bar 120, which may be spaced apart from the first bar 110 in a first direction. In some example embodiments, the infrared microscope 122 may move in the second direction according to the second bar 120. Alternatively, a plurality of infrared microscopes 122 may be mounted on the second bar 120, and the plurality of infrared microscopes 122 may be fixed in the second direction.

The substrate stage 130 may be a substrate supporter to support and transport an acceptor substrate 200. The substrate stage 130 may include a base portion 132, a moving portion 134 and a chuck 136. The chuck 136 may hold the acceptor substrate 200 to the substrate stage 130, and the moving portion 134 may transport the acceptor substrate 200 in the first direction.

The acceptor substrate 200 and the donor substrate 250 may be disposed on the substrate stage 130. The donor substrate 250 may be described with reference to FIG. 2 or FIG. 3 as follows. The acceptor substrate 200 may be described with reference to FIG. 4 as follows.

The laser induced thermal imaging apparatus 100 may further include a control portion (not shown) for controlling the laser beam source 112, the optical system 114 and the substrate stage 130. The laser induced thermal imaging apparatus 100 may further include a mask disposed between the optical system 114 and the donor substrate 250.

Figure 2:
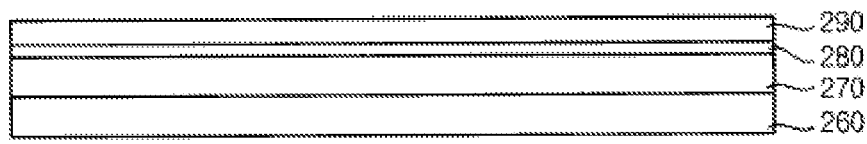

FIG. 2 is a cross-sectional view illustrating a donor substrate for laser induced thermal imaging in accordance with some embodiments.

Referring to FIG. 2, the donor substrate 250 for the laser induced thermal imaging may include a first base substrate 260, a light to heat conversion layer 270, a functional layer 280, a transfer layer 290, etc.

The first base substrate 260 may include a transparent polymer material. For example, the first base substrate 260 may include a polymer such as polyethylene terephthalate, polyester, polyacryl, polyepoxy, polyethylene, polystyrene, etc. The first base substrate 260 may have a thickness of about 10 μm to about 500 μm. If the first base substrate 260 has a thickness below about 10 μm, it is hard to handle the first base substrate 260, because the first base substrate 260 may not have a proper mechanical strength. If the first base substrate 260 has a thickness above about 500 μm, it is hard to transport the first base substrate 260 due to a weight of the first base substrate 260. The first base substrate 260 may serve to support components of the donor substrate 250.

The light to heat conversion layer 270 may be disposed on the first base substrate 260. The light to heat conversion layer 270 may include a light absorption material which may convert the laser beam into a thermal energy. In some example embodiments, the light to heat conversion layer 270 may include a metal such as aluminum, silver, molybdenum, chromium, an oxide thereof or a sulfide thereof. In this case, the light to heat conversion layer 270 may have a relatively small thickness of about 10 nm to about 500 nm. In other example embodiments, the light to heat conversion layer 270 may include an organic material such as carbon black or graphite. In this case, the light to heat conversion layer 270 may have a relatively large thickness of about 100 nm to about 10 μm. The heat generated in the light to heat conversion layer 270 may change a bonding strength between the light to heat conversion layer 270 and the transfer layer 290, such that a portion of the transfer layer 290 may be transferred to an acceptor substrate with a predetermined shape.

In some example embodiments, the light to heat conversion layer 270 may further include a gas generating material such as pentaerythrite tetranitrate (PETN) and trinitrotoluene (TNT). When the light to heat conversion layer 270 absorbs the thermal energy, the gas generating material may emit a nitrogen gas or a hydrogen gas to provide energy for a transfer step in the laser induced thermal imaging process.

The functional layer 280 may be formed using a material radiating an infrared light. In some example embodiments, the functional layer 280 may include silver (Ag) or a halide having a fluorescent property. In other example embodiments, the functional layer 280 may be formed using an ink which can absorb a visible light and can radiate an infrared light (See KR 2010-0110068).

The transfer layer 290 may be disposed on the functional layer 280. When manufacturing an organic light emitting display device using the donor substrate 250, the transfer layer 290 may include a material substantially the same as or substantially similar to that of an organic layer pattern. That is, the organic layer pattern may be formed on the acceptor substrate from the transfer layer 290 of the donor substrate 250. In some example embodiments, the organic layer pattern may include an organic light emitting layer, a hole injection layer, a hole transfer layer, an electron injection layer or an electron transfer layer of the organic light emitting display device. The organic light emitting display device including a plurality of organic layer patterns may be formed from the transfer layer 290.

A buffer layer (not shown) or an intermediate layer (not shown) may be further disposed between the transfer layer 290 and the light to heat conversion layer 270.

According to example embodiments, the donor substrate 250 may further include the functional layer 280 disposed between the light to heat conversion layer 270 and the transfer layer 290. The functional layer 280 may be formed using the fluorescent material or the ink, such that the functional layer 280 may radiate the infrared light. When the donor substrate 250 is used in the laser induced thermal imaging, it is possible to inspect a position of the transferred organic layer pattern by detecting the infrared light from the functional layer 280. Particularly, when the donor substrate 250 is laminated on an acceptor substrate 200 having a stepped portion (See FIG. 4), it is possible to inspect a position of the stepped portion by detecting the infrared light.

Figure 3:
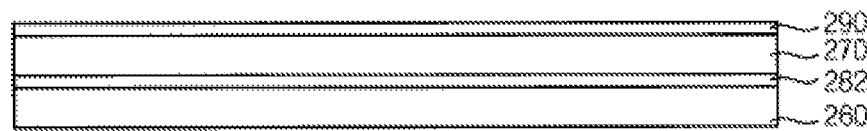

FIG. 3 is a cross-sectional view illustrating a donor substrate for laser induced thermal imaging in accordance with other embodiments. The donor substrate 252 may be substantially the same as or substantially similar to the donor substrate 250 described with reference to FIG. 2, except for a position of a functional layer 282. Thus, like reference numerals refer to like elements, and repetitive explanations thereon may be omitted herein Referring to FIG. 3, the donor substrate 252 may include the first base substrate 260, the light to heat conversion layer 270, the functional layer 282 and the transfer layer 290. In some example embodiments, the functional layer 282 may include a material substantially the same as or substantially similar to that of the functional layer 280 described with reference to FIG. 2.

According to example embodiments, the donor substrate 252 may further include the functional layer 282 disposed between the light to heat conversion layer 270 and the first base substrate 260. Even thought the position of the functional layer 282 is changed compared to FIG. 2, it is possible to inspect the position of the transferred organic layer pattern by detecting the infrared light from the functional layer 282 while the donor substrate 252 is laminated on the acceptor substrate.

Figure 4:
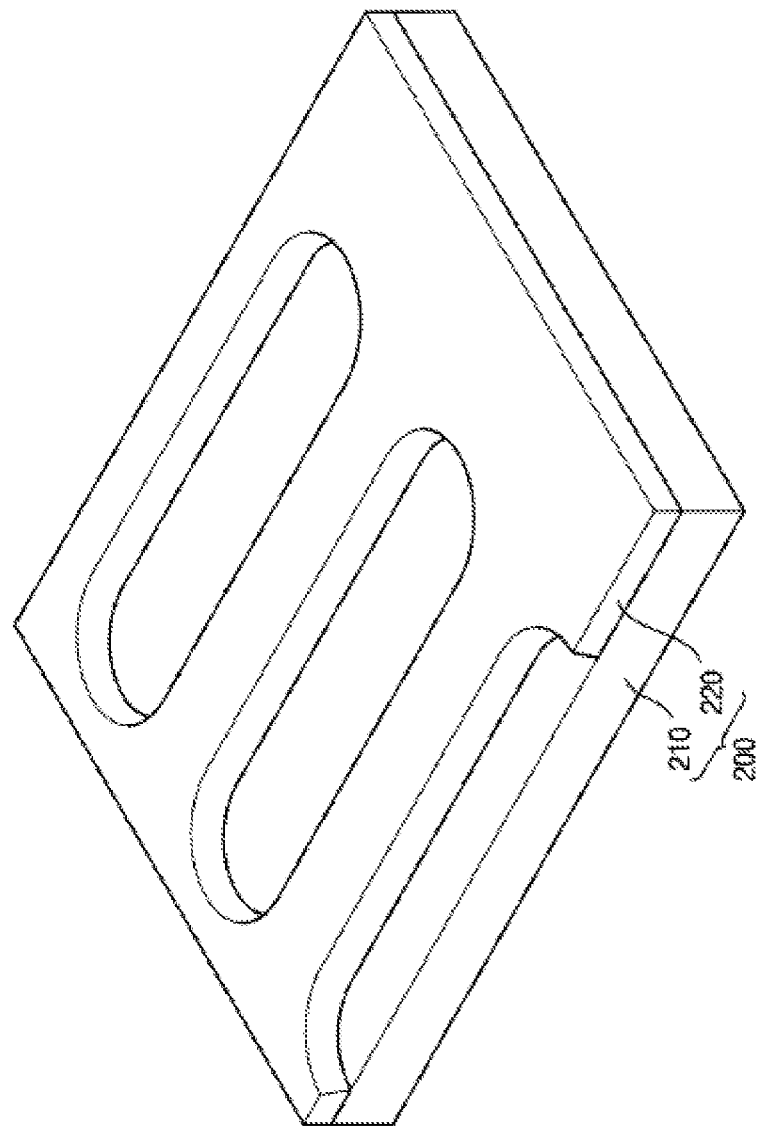

FIG. 4 is a perspective view illustrating an acceptor substrate in FIG. 1.

The acceptor substrate 200 may be any substrate to which an organic layer pattern is transferred. The acceptor substrate 200 may be a substrate for a semiconductor device, a display device, a touch panel, and the like. The acceptor substrate 200 may include a switching structure (not shown) or a semiconductor structure (not shown).

In some example embodiments, the acceptor substrate 200 may include a second base substrate 210 and a pattern layer 220. The second base substrate 210 may have a predetermined flexibility and a predetermined strength. The material of the second base substrate 210 may not be limited.

The pattern layer 220 may be disposed on the second base substrate 210 and may have a predetermined shape. Therefore, a stepped portion may be disposed between a top surface of the second base substrate 210 and a top surface of the pattern layer 220. In some example embodiments, the pattern layer 220 may be a pixel defining layer of the display device. In this case, the pixel defining layer may have a shape to surround a pixel region of the display device.

The donor substrate 250 (See FIG. 2) may be laminated on a top surface of the acceptor substrate 200. That is, the donor substrate 250 may be disposed such that the transfer layer 290 (See FIG. 2) of the donor substrate 250 may directly contact the top surface of the acceptor substrate 200.

The donor substrate 250 may have a relatively large flexibility, so that the donor substrate 250 may be deformed according to a profile of the top surface of the acceptor substrate 200. That is, the donor substrate 250 may be deformed to have a stepped portion according to the profile of the pattern layer 220.

When a laser beam is radiated into the donor substrate 250, an organic layer pattern is transferred to the acceptor substrate 200. The stepped portion of the donor substrate 250 may be easily observed by the infrared microscope 122 (See FIG. 1) due to the infrared light radiated from the functional layer 280 (See FIG. 2). In this case, the edge of the stepped portion may be distinguished from other portion, so that a position of the transferred organic layer pattern may be easily observed, while the donor substrate 250 is laminated on the acceptor substrate 200. That is, without removing the donor substrate 250 from the acceptor substrate 200, it is possible to determine whether or not the organic layer pattern is properly transferred at a predetermined position.

Figure 5:
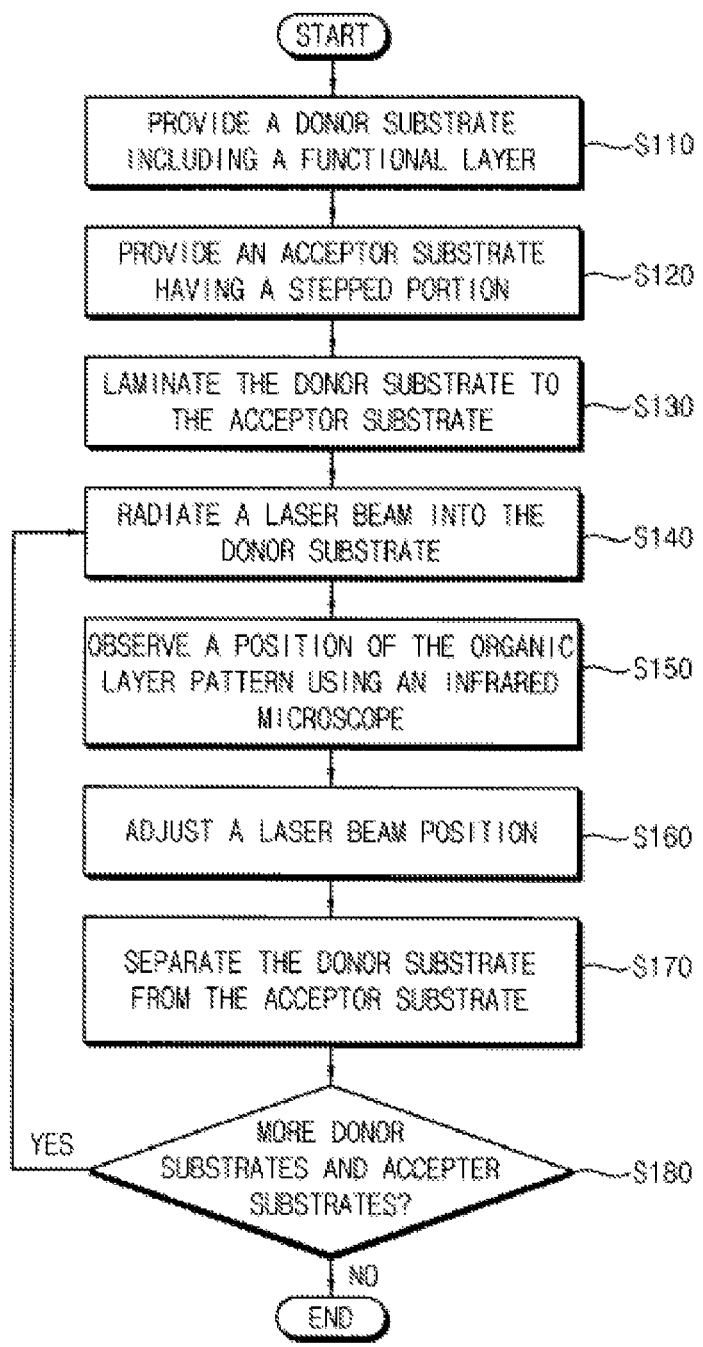

FIG. 5 is a flow chart illustrating a method of laser induced thermal imaging in accordance with some embodiments.

Referring to FIG. 5, a donor substrate 250 (See FIG. 2) including a functional layer 280 (See FIG. 2) may be prepared (S110). The step of preparing the donor substrate 250 may include sequentially forming a light to heat conversion layer 270 (See FIG. 2), the functional layer 280 and a transfer layer 290 (See FIG. 2) on a first base substrate 260 (See FIG. 2).

The first base substrate 260 may include a transparent polymer material. For example, the first base substrate 260 may include a polymer such as polyethylene terephthalate, polyester, polyacryl, polyepoxy, polyethylene, polystyrene, etc.

Then, the light to heat conversion layer 270 may be formed on the first base substrate 260. For example, the light to heat conversion layer 270 may be formed using a metal such as aluminum, silver, molybdenum, chromium, an oxide thereof by a thermal evaporation process, an E-beam evaporation process or a sputtering process. Alternatively, the light to heat conversion layer 270 may be formed using a sulfide thereof or an organic material such as carbon black or graphite by a roll coating process, a gravure coating process, a spin coating process, a knife coating process, and the like.

The functional layer 280 may be formed on the light to heat conversion layer 270 using a material radiating an infrared light. In some example embodiments, the functional layer 280 may be formed using silver (Ag) or a halide having a fluorescent property. In other example embodiments, the functional layer 280 may be formed using an ink which can absorb a visible light and can radiate an infrared light (See KR 2010-0110068). The functional layer 280 may be formed by a roll coating process or a spin coating process.

Then, the transfer layer 290 may be formed on the functional layer 280. The transfer layer 290 may include an organic material which may be thermally transferred to an accepter substrate 200. The transfer layer 290 may be a single layer structure or a multi layer structure. The transfer layer 290 may be formed by an evaporation process, a chemical vapor deposition (CVD) process or a coating process.

The acceptor substrate 200 (See FIG. 4) having a stepped portion may be prepared (S120). In some example embodiment, the acceptor substrate 200 may be a display substrate of a display apparatus. The display substrate may be described with reference to FIG. 7 as follows.

The donor substrate 250 may be laminated on the acceptor substrate 200 (S130). After aligning the donor substrate 250 with respect to the acceptor substrate 200, the donor substrate 250 may be laminated on the acceptor substrate 200 by applying a pressure to the donor substrate 250 using a pressurizing device. In some example embodiments, the pressurizing device may include a roller, a crown press, and the like. Alternatively, the donor substrate 250 may be adhered to the acceptor substrate 200 by applying a pressure to the donor substrate 250 using a gas nozzle.

The acceptor substrate 200 may include the stepped portion and the donor substrate 250 may have a relatively large flexibility, so that the donor substrate 250 may be deformed according to a profile of the stepped portion of the acceptor substrate 200. That is, the donor substrate 250 laminated on the acceptor substrate 200 also may have a stepped portion.

Then, a laser beam may be radiated on the donor substrate 250, so that an organic layer pattern is transferred on the acceptor substrate 200 (S140).

The laser beam may be radiated in a region of the donor substrate 250 where the organic layer pattern is transferred. The laser beam from the laser beam source 112 of the laser induced thermal imaging apparatus 100 (See FIG. 1) may pass through the optical system 114, thereby radiating the donor substrate 250.

In the region where the laser beam is radiated, a bonding strength between the transfer layer 290 and the acceptor substrate 200 may be substantially larger than a bonding strength between the transfer layer 290 and the functional layer 280. Therefore, the organic layer pattern may be transferred on the acceptor substrate 200 with a predetermined shape. The laser beam may have a relatively high resolution, so that the organic layer pattern may be transferred precisely.

A position of the laser beam radiation and a position of the organic layer pattern may be inspected by an infrared microscope 122 (S150).

The infrared microscope 122 may include at least two lenses and a charge coupled device (CCD). For example, the lenses may include an objective lens and an ocular to allow a magnified view of the same. The CCD may have a sufficient sensitivity to an infrared light. Therefore, the infrared microscope 122 may observe the infrared light generated from the donor substrate 250.

Particularly, the donor substrate 250 may be laminated on the acceptor substrate 200 to have the stepped portion, the stepped portion may be easily observed by the infrared microscope 122. That is, the stepped portion of the donor substrate 250 may be pressurized in the lamination process (S130) and may be exposed to the laser beam (S140), so that the infrared light radiated from the stepped portion of the donor substrate 250 (that is, the functional layer 280) may be distinguished from other infrared light radiated from other portion of the donor substrate 250. Therefore, without removing the donor substrate 250 from the acceptor substrate 200, it is possible to observe the position of the laser beam radiation and the position of the organic layer pattern.

The laser beam position may be adjusted depending on the result of observation (S160).

The position of the laser beam radiation may be adjusted according to the position of the organic layer pattern which is observed in the preceding step (S150). For example, the positions of the laser beam source 112, the optical system 114 and the substrate stage 130 may be adjusted. Alternatively, the mirror or the lens in the optical system 114 may be controlled to change the position of the laser beam radiation. Therefore, by adjusting the laser beam position, the position of the organic layer pattern which is formed later may be adjusted. The adjusted laser beam position may be applied to other donor substrate 250 after that time.

The donor substrate 250 may be separated from the acceptor substrate 200 (S170).

The donor substrate 250 may be peeled off from the acceptor substrate 200, after forming the organic layer pattern on the acceptor substrate 200. In this case, an inert gas such as a nitrogen gas, an argon gas, and the like may be sprayed between the acceptor substrate 200 and the donor substrate 250 to promote the separation between the donor substrate 250 and the acceptor substrate 200.

The preceding steps (S140 to S170) may be performed about other acceptor substrate 200 and other donor substrate 250, repeatedly. In the step of S160, the laser beam position may be adjusted, so that the position of the organic layer pattern may be properly arranged.

According to example embodiments, the donor substrate 250 may be laminated on the acceptor substrate 250 to have the stepped portion. The stepped portion of the donor substrate 250 may be easily observed by the infrared microscope 122 (See FIG. 1) due to the infrared light radiated from the functional layer 280 (See FIG. 2). In this case, the edge of the stepped portion may be distinguished from other portion, so that the position of the transferred organic layer pattern may be easily observed, while the donor substrate 250 is laminated on the acceptor substrate 200.

Figure 6:
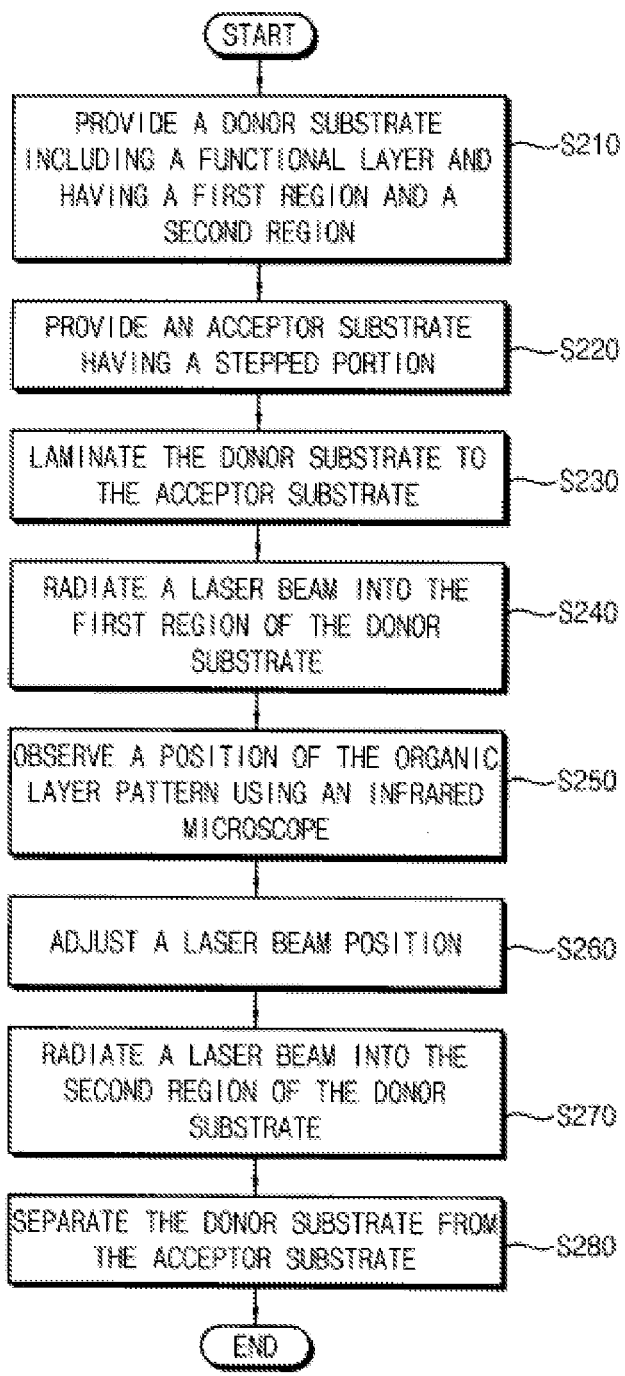

FIG. 6 is a flow chart illustrating a method of laser induced thermal imaging in accordance with some embodiments. The method of laser induced thermal imaging may include steps substantially the same as or substantially similar to those of the method of laser induced thermal imaging described with reference to FIG. 5.

Referring to FIG. 6, a donor substrate 250 (See FIG. 2) including a functional layer 280 (See FIG. 2) may be prepared (S210). In some example embodiments, the donor substrate 250 may be divided into a first region and a second region.

An acceptor substrate 200 having a stepped portion may be prepared (S220). For example, the acceptor substrate 200 may be a display substrate of a display device. The acceptor substrate 200 may be divided into a third region and a fourth region corresponding to the first region and the second region of the donor substrate 250, respectively. For example, the third region may be a display region where the pixel of the display device is disposed, and the fourth region may be a test region for observing a position of a laser beam. The stepped portion may be arranged regularly and repeatedly in the third region and the fourth region.

Then, the donor substrate 250 may be laminated on the acceptor substrate 200 (S230).

A laser beam may be radiated in the first region of the donor substrate 250 (S240).

Then, a position of the laser beam radiation may be inspected by an infrared microscope 122 (S250).

The laser beam position may be adjusted depending on the result of observation (S260).

A laser beam may be radiated in the second region of the donor substrate 250 to form an organic layer pattern in the third region of the acceptor substrate 200 (S240). The laser beam position may be adjusted in the preceding step (S260), so that the laser beam may be properly radiated in the second region of the donor substrate 250. Therefore, the organic layer pattern may be arranged in a predetermined position.

The donor substrate 250 may be separated from the acceptor substrate 200 (S280).

According to example embodiments, the donor substrate 250 may be laminated on the acceptor substrate 250 to have the stepped portion. The stepped portion of the donor substrate 250 may be easily observed by the infrared microscope 122 (See FIG. 1) due to the infrared light radiated from the functional layer 280 (See FIG. 2). In this case, the edge of the stepped portion may be distinguished from other portion, so that the position of the transferred organic layer pattern may be easily observed, while the donor substrate 250 is laminated on the acceptor substrate 200.

FIGS. 7 to 10 are a perspective view and cross-sectional views illustrating a method of manufacturing an organic light emitting display device in accordance with some embodiments.

Figure 7:
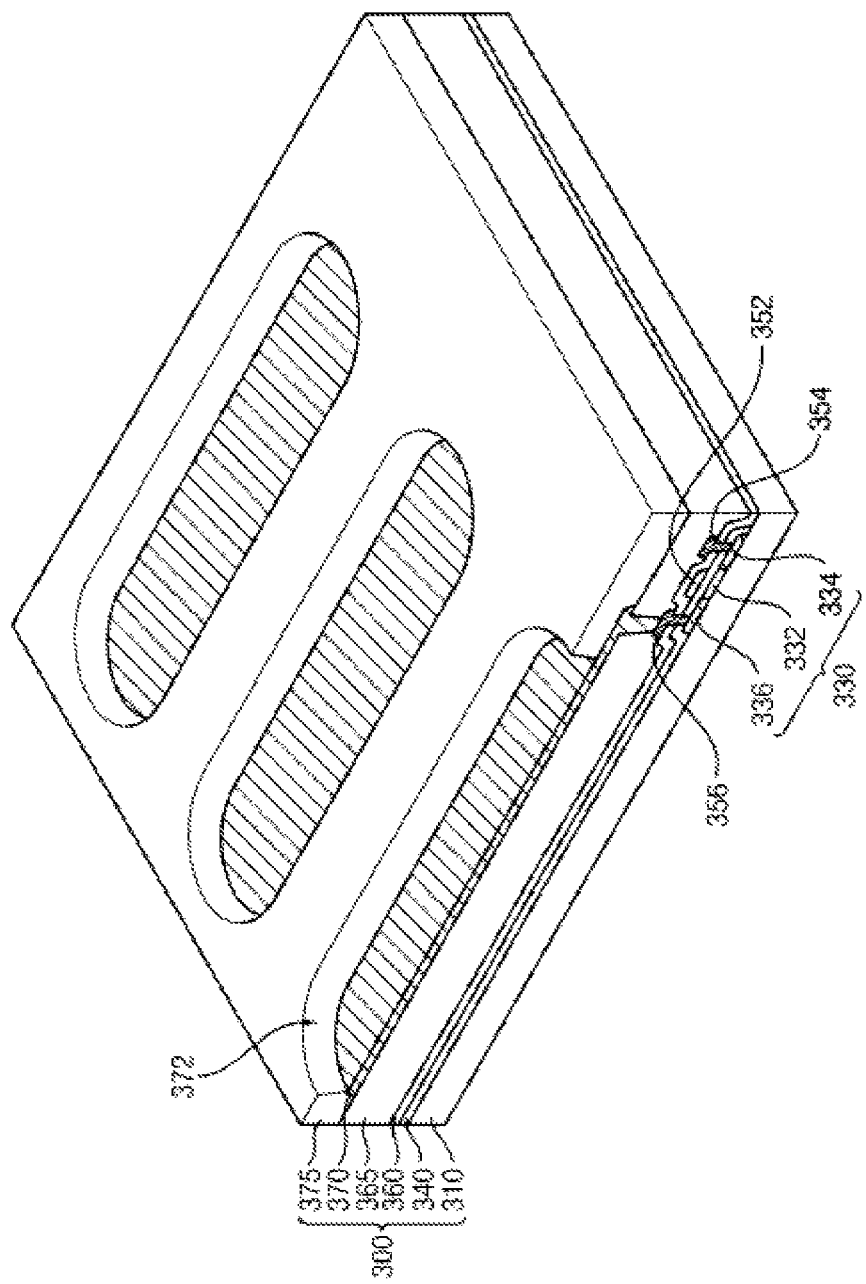

Referring to FIG. 7, a display substrate 300 may be prepared to include a first electrode 370 and a pixel defining layer 375.

In some example embodiments, the display substrate 300 may include a first substrate 310, a switching structure, insulation layers, the first electrode 370, the pixel defining layer 375, and the like.

The first substrate 310 may include a transparent insulation substrate. For example, the first substrate 310 may include a glass substrate, a quartz substrate, a transparent polymer substrate, and the like. In other example embodiments, the first substrate 310 may be a flexible substrate.

When the organic light emitting display device has an active matrix type, the switching structure may be formed on the first substrate 310. In some example embodiments, the switching structure may include a switching device, at least one insulation layer, a contact, a pad, a plug, etc. Here, the switching device may include a thin film transistor (TFT), an oxide semiconductor device, etc.

When the switching device in the switching structure includes the thin film transistor, the switching device may be obtained by forming a semiconductor layer 330, a gate electrode 352, a source electrode 354, a drain electrode 356, etc.

In some example embodiments, the semiconductor layer 330 may be disposed on the first substrate 310, and the semiconductor layer 330 may be divided into a source region 334, a drain region 336 and a channel region 332 through an ion implantation process. Then, a gate insulation layer 340 may be disposed to electrically isolate the semiconductor layer 330.

A gate electrode 352 may be disposed on the gate insulation layer 340, and then a first insulation layer 360 may be disposed on the gate insulation layer 340 and the gate electrode 352.

The source electrode 354 and the drain electrode 356 may be disposed through the gate insulation layer 340 and the first insulation layer 360 to contact the source and the drain regions 334 and 336, respectively. A gate signal may be applied to the gate electrode 352 and a data signal may be applied to the source electrode 354. Then, a second insulation layer 360 may be disposed to electrically isolate the source electrode 354 and the drain electrode 356.

In the organic light emitting display device illustrated in FIG. 7, the switching device including the thin film transistor may have a top gate configuration in which the gate electrode 352 may be disposed over the semiconductor layer 330, however, the configuration of the switching device may not be limited thereto. For example, the switching device may have a bottom gate configuration in which a gate electrode may be disposed under the semiconductor layer.

A second insulation layer 365 may be disposed on the first insulation layer 360 to substantially cover the source electrode 354 and the drain electrode 356. In some example embodiments, the second insulation layer 365 may have a substantially flat surface obtained by a planarization process, for example, a chemical mechanical polishing (CMP) process, an etch-back process, etc.

The first electrode 370 may be formed on the switching structure, and a pixel defining layer 375 may be formed in a region on the switching structure where the first electrode 370 is not positioned.

In some example embodiments, the first electrode 370 may serve as an anode for providing holes into a light emitting structure. Depending on an emission type of the organic light emitting display device, the first electrode 370 may be a transparent electrode or a semi-transparent electrode. For example, the first electrode 370 may be formed using a transparent conductive material such as indium tin oxide (ITO), zinc tin oxide (ZTO), indium zinc oxide (IZO), zinc oxide (ZnOx), tin oxide (SnOx), gallium oxide (GaOx), etc.

In some example embodiments, the pixel defining layer 375 may be formed using an insulation material. The pixel defining layer 375 may have a thickness substantially larger than that of the first electrode 375. Therefore, a stepped portion 372 may be disposed between a top surface of the pixel defining layer 375 and a top surface of the first electrode 370.

Figure 8:
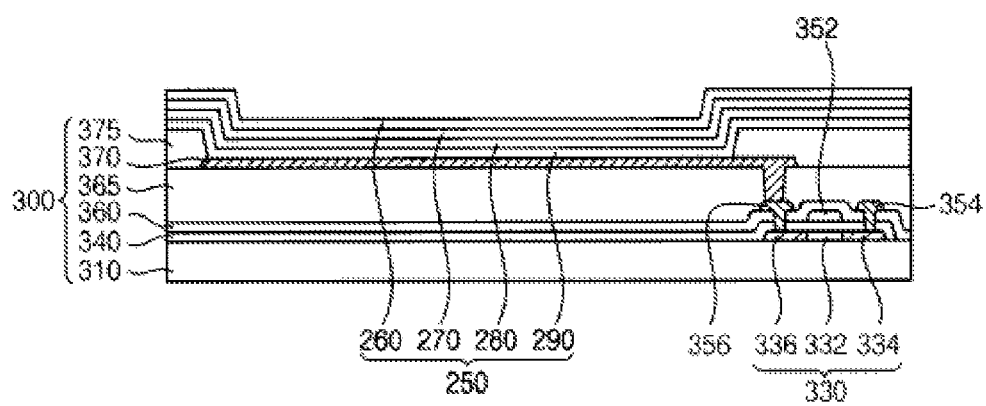

Referring to FIG. 8, a donor substrate 250 may be laminated on the display substrate 300.

The donor substrate 250 may be substantially the same as or substantially similar to the donor substrate 250 described with reference to FIG. 2.

After aligning the donor substrate 250 with respect to the display substrate 300, the donor substrate 250 may be laminated on the display substrate 300 by applying a pressure to the donor substrate 250 using a pressurizing device. In some example embodiments, the pressurizing device may include a roller, a crown press, and the like. Alternatively, the donor substrate 250 may be adhered to the display substrate 300 by applying a pressure to the donor substrate 250 using a gas nozzle.

The display substrate 300 may include the stepped portion 372 and the donor substrate 250 may have a relatively large flexibility, so that the donor substrate 250 may be deformed according to a profile of the stepped portion 372 of the display substrate 300. That is, the donor substrate 250 laminated on the display substrate 300 also may have a stepped portion.

Figure 9:
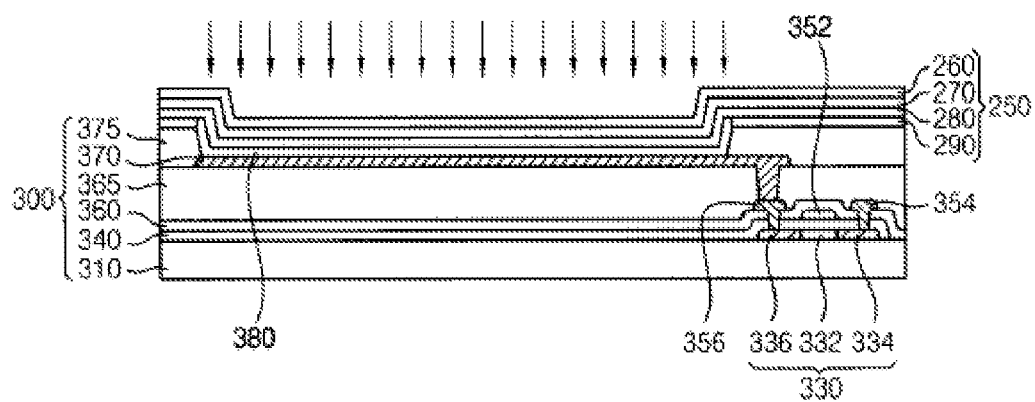

Referring to FIG. 9, a laser beam may be radiated on the donor substrate 250.

The laser beam may be radiated, such that an organic layer pattern 380 may be transferred from the transfer layer 290 of the donor substrate 250 onto the display substrate 300.

The organic layer pattern 380 (see FIG. 10) may be formed from the transfer layer 290 at a pressure below about $10^{-2}$ Torr. The organic layer pattern 380 may be formed in a vacuum chamber, so that pollutions of the display substrate 300 and the organic layer pattern 380 may be prevented in a formation of the organic layer pattern 380. As a result, a life time of the organic light emitting display device including the organic layer pattern 380 may be enlarged.

In some example embodiments, the organic layer pattern 380 may be formed in an atmosphere containing an inert gas. For example, the atmosphere may include the inert gas and water vapor, or the inert gas and an oxygen gas ($O_2$). For example, the inert gas may include a nitrogen ($N_2$) gas and/or an argon (Ar) gas, and a concentration of water vapor in the atmosphere containing the inert gas may be below about 10 ppm. Alternatively, a concentration of oxygen gas ($O_2$) in the atmosphere containing the inert gas may be below about 50 ppm. A pollution of the organic layer pattern 380 may be prevented by controlling concentrations of water vapor and oxygen gas.

Then, a position of the laser beam radiation and a position of the organic layer pattern 380 may be inspected by an infrared microscope 122 (See FIG. 1)

The infrared microscope 122 may observe the infrared light generated from the functional layer 280 of the donor substrate 250. Particularly, the donor substrate 250 may be laminated on the display substrate 300 to have the stepped portion, the stepped portion may be easily observed by the infrared microscope 122. That is, the stepped portion of the donor substrate 250 may be pressurized in the lamination process and may be exposed to the laser beam, so that the infrared light radiated from the stepped portion of the donor substrate 250 may be distinguished from other infrared light radiated from other portion of the donor substrate 250. Therefore, without removing the donor substrate 250 from the display substrate 300, it is possible to observe the position of the laser radiation and the position of the organic layer pattern 380.

Then, the laser beam position may be adjusted depending on the result of observation.

Figure 10:
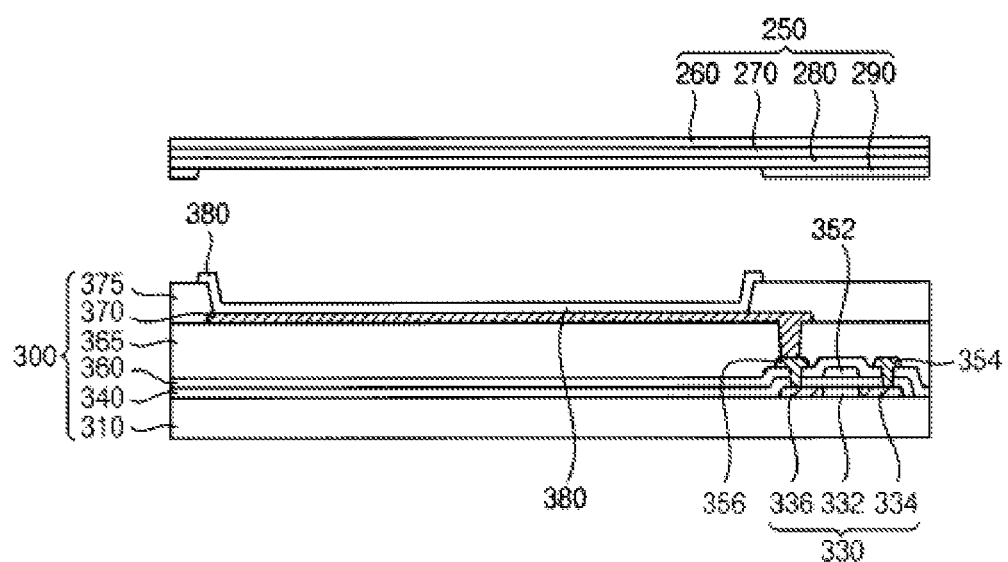

Referring to FIG. 10, donor substrate 250 may be separated from the display substrate 300.

The donor substrate 250 may be peeled off from the display substrate 300, after forming the organic layer pattern on the display substrate 300. In this case, an inert gas such as a nitrogen gas, an argon gas, and the like may be sprayed between the display substrate 300 and the donor substrate 250 to promote the separation between the donor substrate 250 and the display substrate 300.

The method of manufacturing the organic light emitting display device may use the donor substrate 250 described with reference to FIG. 2, the present embodiments may not be limited thereto. For example, the method of manufacturing the organic light emitting display device may use the donor substrate 252 described with reference to FIG. 3.

In some example embodiments, the organic layer pattern 380 may be an organic light emitting layer, however the present embodiments may not be limited thereto. For example, the organic layer pattern 380 may be a hole injection layer (HIL), a hole transport layer (HTL), an electron injection layer (EIL), an electron transport layer (ETL) or a color filter layer.

According to example embodiments, the donor substrate 250 including the functional layer 280 containing the material radiating an infrared light may be used to perform the laser induced thermal imaging, thereby forming the organic layer pattern 380. Therefore, the position of the organic layer pattern may be easily observed, before the donor substrate 250 is separated from the display substrate 300.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present embodiments. Accordingly, all such modifications are intended to be included within the scope of the present embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A donor substrate, comprising:
a base substrate;
a light to heat conversion layer on the base substrate;
a transfer layer on the light to heat conversion layer; and
a functional layer contacting a surface of the light to heat conversion layer, the functional layer directly contacting the light to heat convention layer,
wherein the functional layer includes a material radiating an infrared light, and
wherein the functional layer is disposed between the light to heat conversion layer and the base substrate.

2. A donor substrate, comprising:
a base substrate;
a light to heat conversion layer on the base substrate;
a transfer layer on the light to heat conversion layer; and
a functional layer contacting a surface of the light to heat conversion layer,
wherein the functional layer includes a material radiating an infrared light,
wherein the functional layer includes a material having a fluorescent property, and
wherein the functional layer is disposed between the light to heat conversion layer and the transfer layer.

* * * * *